(12) United States Patent
Sattler et al.

(10) Patent No.: US 11,621,330 B2
(45) Date of Patent: Apr. 4, 2023

(54) SEMICONDUCTOR WAFER OF MONOCRYSTALLINE SILICON AND METHOD OF PRODUCING THE SEMICONDUCTOR WAFER

(71) Applicant: SILTRONIC AG, Munich (DE)

(72) Inventors: Andreas Sattler, Trostberg (DE); Alexander Vollkopf, Burghausen (DE); Karl Mangelberger, Ach (AT)

(73) Assignee: SILTRONIC AG, Munich (DE)

( * ) Notice: Subject to any disclaimer, the term of this patent is extended or adjusted under 35 U.S.C. 154(b) by 0 days.

(21) Appl. No.: 17/835,241

(22) Filed: Jun. 8, 2022

(65) Prior Publication Data

US 2022/0328636 A1 Oct. 13, 2022

Related U.S. Application Data

(62) Division of application No. 16/636,352, filed as application No. PCT/EP2018/069584 on Jul. 19, 2018, now Pat. No. 11,417,733.

(30) Foreign Application Priority Data

Aug. 4, 2017 (DE) .......................... 102017213587.5

(51) Int. Cl.
*H01L 21/02* (2006.01)
*H01L 29/32* (2006.01)
(Continued)

(52) U.S. Cl.
CPC ............ *H01L 29/32* (2013.01); *C30B 15/206* (2013.01); *C30B 25/20* (2013.01); *C30B 29/06* (2013.01);
(Continued)

(58) Field of Classification Search
None
See application file for complete search history.

(56) References Cited

U.S. PATENT DOCUMENTS

| 5,951,755 A | 9/1999 | Miyashita et al. |
| 6,565,822 B1 | 5/2003 | Hoshi et al. |
| (Continued) | | |

FOREIGN PATENT DOCUMENTS

| DE | 102014221421 B3 | 12/2015 |
| EP | 1926134 A1 | 5/2008 |
| KR | 20100025728 A | 3/2010 |

OTHER PUBLICATIONS

Wolf Stanley et al., "Chapter 2 Chrystalline defects and gettering," pp. 35-69, XP009147355.
(Continued)

*Primary Examiner* — Jack S Chen
(74) *Attorney, Agent, or Firm* — Brooks Kushman P.C.

(57) ABSTRACT

Epitaxially coated semiconductor wafers of monocrystalline silicon comprise a p$^+$-doped substrate wafer and a p-doped epitaxial layer of monocrystalline silicon which covers an upper side face of the substrate wafer;
an oxygen concentration of the substrate wafer of not less than $5.3 \times 10^{17}$ atoms/cm$^3$ and not more than $6.0 \times 10^{17}$ atoms/cm$^3$;
a resistivity of the substrate wafer of not less than 5 mΩcm and not more than 10 mΩcm; and
the potential of the substrate wafer to form BMDs as a result of a heat treatment of the epitaxially coated semiconductor wafer, where a high density of BMDs has a maximum close to the surface of the substrate wafer.

6 Claims, 4 Drawing Sheets

(51) Int. Cl.
   *C30B 15/20* (2006.01)
   *C30B 25/20* (2006.01)
   *C30B 29/06* (2006.01)
   *H01L 29/16* (2006.01)

(52) U.S. Cl.
   CPC .. *H01L 21/02381* (2013.01); *H01L 21/02428* (2013.01); *H01L 21/02532* (2013.01); *H01L 21/02579* (2013.01); *H01L 21/02598* (2013.01); *H01L 29/16* (2013.01)

(56) References Cited

U.S. PATENT DOCUMENTS

| | | |
|---|---|---|
| 11,417,733 B2 * | 8/2022 | Sattler .................... H01L 29/32 |
| 2011/0300371 A1 | 12/2011 | Omote et al. |
| 2014/0141537 A1 | 5/2014 | Falster et al. |
| 2020/0168712 A1 | 5/2020 | Sattler et al. |

OTHER PUBLICATIONS

Nakashima et al., Journal of The Electrochemical Society, 147 (11), 4294-4296 (2000).

* cited by examiner

SEMICONDUCTOR WAFER OF MONOCRYSTALLINE SILICON AND METHOD OF PRODUCING THE SEMICONDUCTOR WAFER

CROSS REFERENCE TO RELATED APPLICATIONS

This application is a Divisional of U.S. Ser. No. 16/636,352, filed Feb. 4, 2020, (now U.S. Pat. No. 11,417,733 B2, issued Aug. 16, 2022), which is the U.S. National Phase of PCT Appln. No. PCT/EP2018/069584 filed Jul. 19, 2018, which claims priority to German Application No. 10 2017 213 587.5 filed Aug. 4, 2017, the disclosures of which are incorporated in their entirety by reference herein.

BACKGROUND OF THE INVENTION

1. Field of the Invention

The invention provides an epitaxially coated semiconductor wafer of monocrystalline silicon and a method of producing the semiconductor wafer. The semiconductor wafer is a $p/p^+$ epitaxially coated semiconductor wafer and comprises a substrate wafer of monocrystalline silicon covered with an epitaxial layer of monocrystalline silicon. The substrate wafer and the epitaxial layer have been doped with boron, the dopant concentration in the substrate wafer being significantly greater.

The substrate wafer is divided from a single crystal which has been pulled by the Czochralski method (CZ method). The CZ method comprises the pulling of the single crystal from a melt present in a crucible. The substrate wafer is generally processed mechanically, etched and polished before the epitaxial layer is deposited by means of gas phase deposition (chemical vapor deposition, CVD) on a polished upper side face of the substrate wafer.

2. Description of the Related Art

US 2011/0300371 A1 mentions, for example, that a $p/p^+$ epitaxially coated semiconductor wafer is particularly suitable as base material for production of solid-state image sensors. The high dopant concentration in the substrate wafer facilitates the formation of oxygen precipitates which are required as what are called internal getters for binding of metallic impurities, keeping them away from the epitaxial layer.

U.S. Pat. No. 6,565,822 B1 describes a method of producing single crystals from silicon with a high boron concentration by the CZ method and the production of epitaxially coated semiconductor wafers proceeding from substrate wafers that are obtained from such single crystals. In the pulling of the single crystals, the melt is subjected to a horizontal magnetic field.

Oxygen precipitates, called BMDs (bulk microdefects), evolve from BMD nuclei. Such BMD nuclei do not withstand heat treatment of the substrate wafer at high temperatures if they are too small. On deposition of the epitaxial layer, therefore, BMD nuclei can be extinguished. A heat treatment is likewise necessary for growing of BMDs from BMD nuclei, which is advantageously undertaken in the course of the further processing of the epitaxially coated semiconductor wafer to form electronic components. There is a trend for the thermal processes in the course of this further processing to proceed at lower temperatures and with a lower thermal budget than before, and for that reason there is a greater challenge in providing an epitaxially coated semiconductor wafer which, under these circumstances, already has a sufficiently high getter efficiency from the start of the component production.

In order to achieve a sufficiently high density of BMDs, US 2011/0300371 A1 proposes deliberately doping the substrate wafer with carbon and optionally with nitrogen, and subjecting the epitaxially coated semiconductor wafer to a heat treatment. Additional doping with carbon and/or with nitrogen complicates the production of the single crystal and harbors the risk that stacking fault defects will form, triggered by additional dopants. Subjecting the epitaxially coated semiconductor wafer to a heat treatment which is not envisaged in the course of further processing thereof to give electronic components is uneconomical, as is a heat treatment of the substrate wafer prior to the deposition of the epitaxial layer.

DE 10 2014 221 421 B3 proposes dispensing with the deliberate doping of the melt with nitrogen and omitting any heat treatment of the substrate wafer prior to the deposition of the epitaxial layer. However, particular attention is paid to the pulling of the single crystal, ensuring inter alia that the concentration of oxygen in the single crystal is not less than $5 \times 10^{17}$ atoms/cm$^3$ and not more than $6 \times 10^{17}$ atoms/cm$^3$ and the resistivity of the single crystal is not less than 10 mΩcm and not more than 20 mΩcm, and the single crystal is cooled within the temperature range from 1000° C. to 800° C. at a rate of not less than 0.5° C./min and not more than 1.2° C./min.

However, it has been found that an epitaxially coated semiconductor wafer which is produced by the process described in DE 10 2014 221 421 B3 no longer meets current demands.

It is therefore an object of the present invention to provide an epitaxially coated semiconductor wafer which meets these demands, and to show how such a semiconductor wafer can be produced.

SUMMARY OF THE INVENTION

These and other objects of the invention are achieved by an epitaxially coated semiconductor wafer of monocrystalline silicon, comprising a $p^+$-doped substrate wafer;

a p-doped epitaxial layer of monocrystalline silicon which covers an upper side face of the substrate wafer;

an oxygen concentration of the substrate wafer of not less than $5.3 \times 10^{17}$ atoms/cm$^3$ and not more than $6.0 \times 10^{17}$ atoms/cm$^3$;

a resistivity of the substrate wafer of not less than 5 mΩcm and not more than 10 mΩcm; and the potential of the substrate wafer to form BMDs as a result of a heat treatment of the epitaxially coated semiconductor wafer, where the density of BMDs has a maximum of not less than $2 \times 10^{17}$/cm$^3$, the distance of the maximum from a front side of the epitaxially coated semiconductor wafer is not greater than 20 μm, and the ratio of the densities of BMDs at a distance of 20 μm and at a distance of 60 μm from the front side of the epitaxially coated semiconductor wafer is not less than 5.

DETAILED DESCRIPTION OF THE PREFERRED EMBODIMENTS

Figure 1:
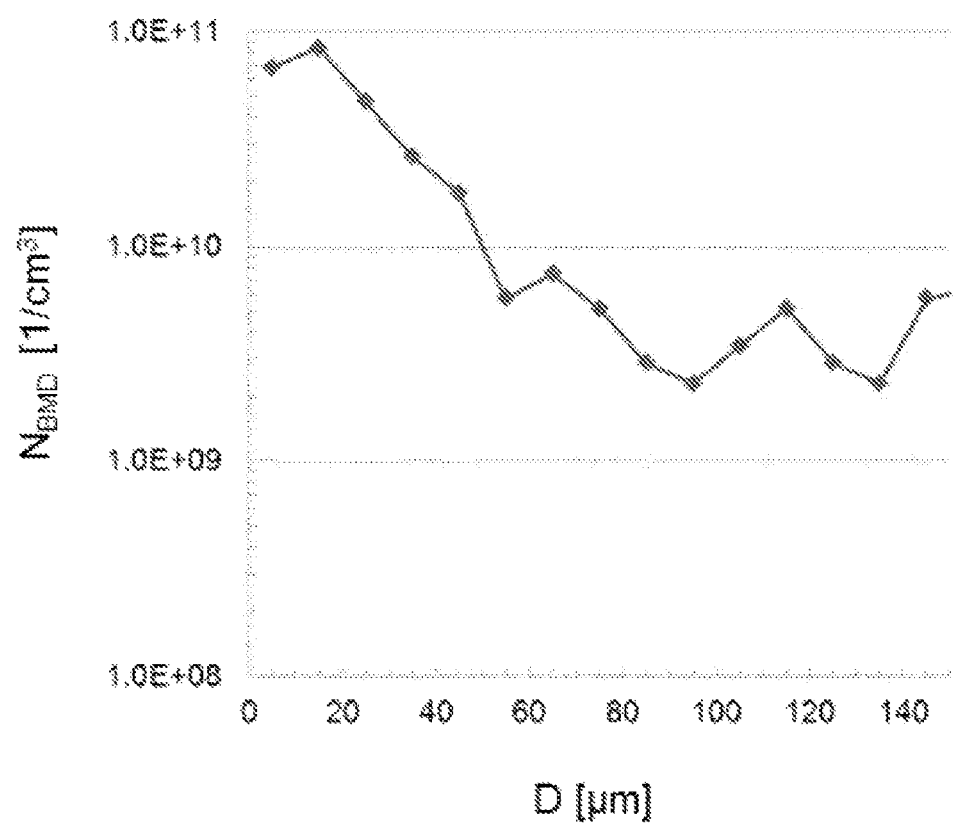
FIGS. 1, 3 and 4 each show the profile of the density of BMDs ($N_{BMD}$) as a function of the distance (D) from the front side of an epitaxially coated semiconductor wafer which represents an example.

The substrate wafer contains an amount of boron sufficient to adjust the resistivity (the specific electrical resistance) to not less than 5 mΩcm and not more than 10 mΩcm. Preferably, the resistivity is not less than 6 mΩcm and less than 10 mΩcm.

The oxygen concentration of the substrate wafer is not less than $5.3 \times 10^{17}$ atoms/cm$^3$ and not more than $6.0 \times 10^{17}$ atoms/cm$^3$ (new ASTM).

The substrate wafer has not been deliberately doped with carbon and therefore contains preferably not more than $1 \times 10^{16}$ atoms/cm$^3$ of this element, more preferably not more than $1 \times 10^{15}$ atoms/cm$^3$. The substrate wafer has also not been deliberately doped with nitrogen and therefore preferably contains not more than $1 \times 10^{12}$ atoms/cm$^3$ of this element.

The thickness of the epitaxial layer is preferably not less than 1 μm and not more than 5 μm, more preferably 2 μm to 3 μm.

The epitaxially coated semiconductor wafer has a denuded zone, i.e. a region which extends from the front side into the interior and in which no BMDs are formed. The denuded zone has a thickness of preferably not less than 3 μm and not more than The diameter of the epitaxially coated semiconductor wafer is not less than 200 mm, preferably not less than 300 mm.

The substrate wafer contains BMD nuclei which can be developed by a heat treatment to give BMDs. The heat treatment is preferably effected in a furnace and preferably in the course of the further processing of the epitaxially coated semiconductor wafer to give electronic components.

The heat treatment is conducted, for example, at a temperature of 850° C. over a period of 1 h in oxygen or, for example, at a temperature of 900° C. over a period of 30 min in argon, or is, for example, a two-stage heat treatment consisting of heating of the epitaxially coated semiconductor wafer to a temperature of 850° C. over a period of 1 h and subsequently heating to a temperature of 1000° C. over a period of 1 h in oxygen.

Irrespective of which of these three options is implemented, the substrate wafer of the epitaxially coated semiconductor wafer after the implemented heat treatment or a heat treatment with a comparable thermal budget has the following properties: the density of BMDs has a maximum of not less than $2 \times 10^{10}$/cm$^3$, and the distance of this maximum from the front side of the epitaxially coated semiconductor wafer is not more than 20 μm. In addition, the quotient of the density of BMDs at a distance of 20 μm from the front side and the density of BMDs at a distance of 60 μm from the front side is not less than 5, where the surface of the epitaxial layer facing away from the substrate wafer forms the front side of the coated semiconductor wafer.

The profile of the density of BMDs from the front side into the interior of the epitaxially coated semiconductor wafer is preferably determined by counting defects with an optical microscope, specifically at a fracture edge of the epitaxially coated semiconductor wafer after preparation (delineation) of the BMDs by RIE (reactive ion etching). The preparation method by means of RIE has been described, for example, by Nakashima et al. in the Journal of The Electrochemical Society, 147 (11), 4294-4296 (2000).

The invention further provides a method of producing a p/p$^+$ epitaxially coated semiconductor wafer of monocrystalline silicon, comprising:

the pulling of a single crystal of silicon at a pulling rate from a melt doped with boron and present in a crucible, where the concentration of oxygen in an envisaged section of the single crystal is not less than $5.3 \times 10^{17}$ atoms/cm$^3$ and not more than $6.0 \times 10^{17}$ atoms/cm$^3$ and the resistivity of the single crystal is not less than 5 mΩcm and not more than 10 mΩcm;

the cooling of the single crystal within a first temperature range from 600° C. to 500° C., where the dwell time within the first temperature range is not less than 353 min and not more than 642 min, and the cooling of the single crystal within a second temperature range from 500° C. to 400° C., where the dwell time within the second temperature range is not less than 493 min and not more than 948 min;

the dividing of a substrate wafer from the envisaged section of the cooled single crystal; and the depositing of a p-doped epitaxial layer of monocrystalline silicon on a polished upper side face of the substrate wafer.

The dwell time within the first temperature range is preferably not less than 353 min and not more than 514 min. The dwell time within the second temperature range is preferably not less than 493 min and not more than 759 min.

Within a third temperature range from 1000° C. to 800° C., the dwell time is preferably not less than 105 min and not more than 157 min.

There are important differences from the process described in DE 10 2014 221 421 B3. The melt is doped with a greater amount of boron, such that the resistivity of the single crystal is not less than 5 mΩcm and not more than 10 mΩcm, preferably not less than 6 mΩcm and less than 10 mΩcm.

In addition, in the cooling of the single crystal, it is ensured that the single crystal cools down comparatively slowly within the temperature range from 600° C. to 500° C. and within the temperature range from less than 500° C. to 400° C.

The single crystal can be cooled down, for example, in the presence of a water-cooled cooler. The dwell times envisaged may especially be established via the arrangement and the performance of the cooler and via the pulling rate with which the single crystal is pulled out of the melt. A favorable combination of arrangement, power and pulling rate can be discovered, for example, via simulation calculations. It is also possible to dispense with the cooler. In this case, the pulling rate necessary for the desired dwell times needs to be determined for a given configuration of the apparatus for pulling the single crystal.

The pulling rate is preferably not less than 0.4 mm/min and not more than 1.8 mm/min, this range being crucial particularly for pulling of single crystals having diameters of 200 mm, 300 mm or greater.

The melt is preferably subjected to a magnetic field. The magnetic field is preferably a horizontal magnetic field.

Deliberate doping of the melt with carbon or with nitrogen or with carbon and nitrogen is omitted.

As described, for example, in DE 10 2014 221 421 B3, the pulled single crystal is processed further to give substrate wafers of monocrystalline silicon, and the substrate wafers to give epitaxially coated semiconductor wafers. The operating steps preferably include the mechanical processing of a substrate wafer, for example the lapping and/or the grinding of the side faces of the substrate wafer, and the rounding of the edge of the substrate wafer. The substrate wafer is preferably also subjected to chemical etching and chemical-mechanical polishing. It therefore has a polished edge and at least one polished side face. Preferably, the upper and lower side faces are polished. The epitaxial layer of silicon is deposited on a polished side face. This step is preferably conducted in a single-wafer reactor, for example in a reactor of the Centura® type supplied by Applied Materials. The deposition gas preferably contains a hydrogen-containing silane, for example trichlorosilane (TCS), and a dopant-containing gas. The deposition temperature in the case of use of TCS is within a temperature range of preferably not less than 1000° C. and not more than 1250° C.

The deposition of the epitaxial layer is the first heat treatment of the substrate wafer, which is effected at a temperature of more than 700° C.

The invention is described further hereinafter with reference to drawings and examples.

Example:

A single crystal of monocrystalline silicon was pulled by the CZ method at a pulling rate of 0.57 mm/min. The single crystal was cooled using a water-cooled cooler. The melt had been doped with boron only and had been subjected to a horizontal magnetic field. Details of dwell times (dt) with which the single crystal has been cooled within the crucial temperature intervals can be found in the table below. Substrate wafers divided from the single crystal with a diameter of 300 mm and a thickness of 775 µm, an oxygen concentration of $5.7 \times 10^{17}/cm^3$ and a resistivity of 9 mΩcm were processed further to give $p/p^+$ epitaxially coated semiconductor wafers of silicon. The thickness of the epitaxial layer was 3 µm.

The potential of such an epitaxially coated semiconductor wafer to be able to form BMDs was ascertained after the two-stage heat treatment (850° C., 1 h and 1000° C., 1 h, each in oxygen) of the epitaxially coated semiconductor wafer by means of RIE and defect counts in an optical microscope. An RIE system of the Plasmalab System 133 type from the manufacturer OXFORD INSTRUMENTS was used in conjunction with HBr, $O_2$, $Cl_2$ and Ar as gases for etching. At a pressure of 2 Pa and with an rf power of 350 W, etching was effected with a selectivity in the region of 1:100 ($SiO_2$:Si).

FIG. 1 shows the profile of the density of BMDs ($N_{BMD}$) as a function of the distance (D) from the front side of an epitaxially coated semiconductor wafer. Accordingly, there is a rise in the density of BMDs even at a comparatively small distance from the front side to a maximum of somewhat less than $1 \times 10^{11}/cm^3$, in order then to drop to values in the region of $5 \times 10^9/cm^3$ within a comparatively short distance.

Comparative Example:

A single crystal of monocrystalline silicon was pulled by the CZ method at a pulling rate of 0.57 mm/min. Details of dwell times (dt) with which the single crystal was cooled in particular temperature intervals can be found in the table below. Substrate wafers divided from the single crystal with a diameter of 300 mm and a thickness of 775 µm, an oxygen concentration of $5.5 \times 10^{17}/cm^3$ and a resistivity of 8 mΩcm were processed further to give $p/p^+$ epitaxially coated semiconductor wafers of silicon. The thickness of the epitaxial layer was 3 µm.

The potential of such an epitaxially coated semiconductor wafer to be able to form BMDs was ascertained after the two-stage heat treatment (850° C., 1 h and 1000° C., 1 h, each in oxygen) of the epitaxially coated semiconductor wafer by means of RIE and defect counts in an optical microscope.

Figure 2:
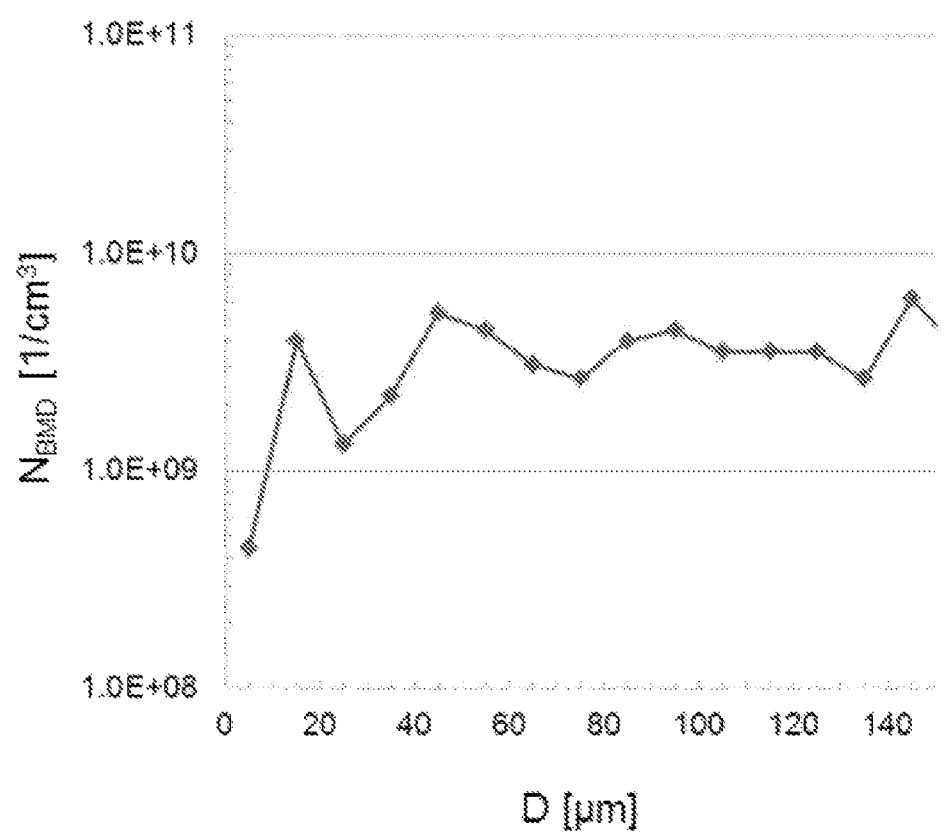
FIG. 2 shows the profile of the density of BMDs ($N_{BMD}$) as a function of the distance (D) from the front side of an epitaxially coated semiconductor wafer which represents a comparative example.

FIG. 2 shows the profile of the density of BMDs ($N_{BMD}$) as a function of the distance (D) from the front side of an epitaxially coated semiconductor wafer. Accordingly, no maximum of BMDs with the required property is obtained close to the front side and the density of BMDs remains clearly below $1 \times 10^{10}/cm^3$.

TABLE

|  | dt 1000° C.-800° C. (min) | dt 700° C.-600° C. (min) | dt 600° C.-500° C. (min) | dt 500° C.-400° C. (min) |
|---|---|---|---|---|
| Example | 147 | 218.5 | 390.5 | 562.5 |
| Comparative example | 365 | 255 | 285 | 400 |

The data show that the dwell time in the temperature ranges from 600° C. onward is of particular significance. It must be comparatively long in order that the desired BMD profile can develop.

A similar profile of BMD densities is also obtained when, instead of the two-stage heat treatment, one of the above-described heat treatments is conducted.

Figure 3:
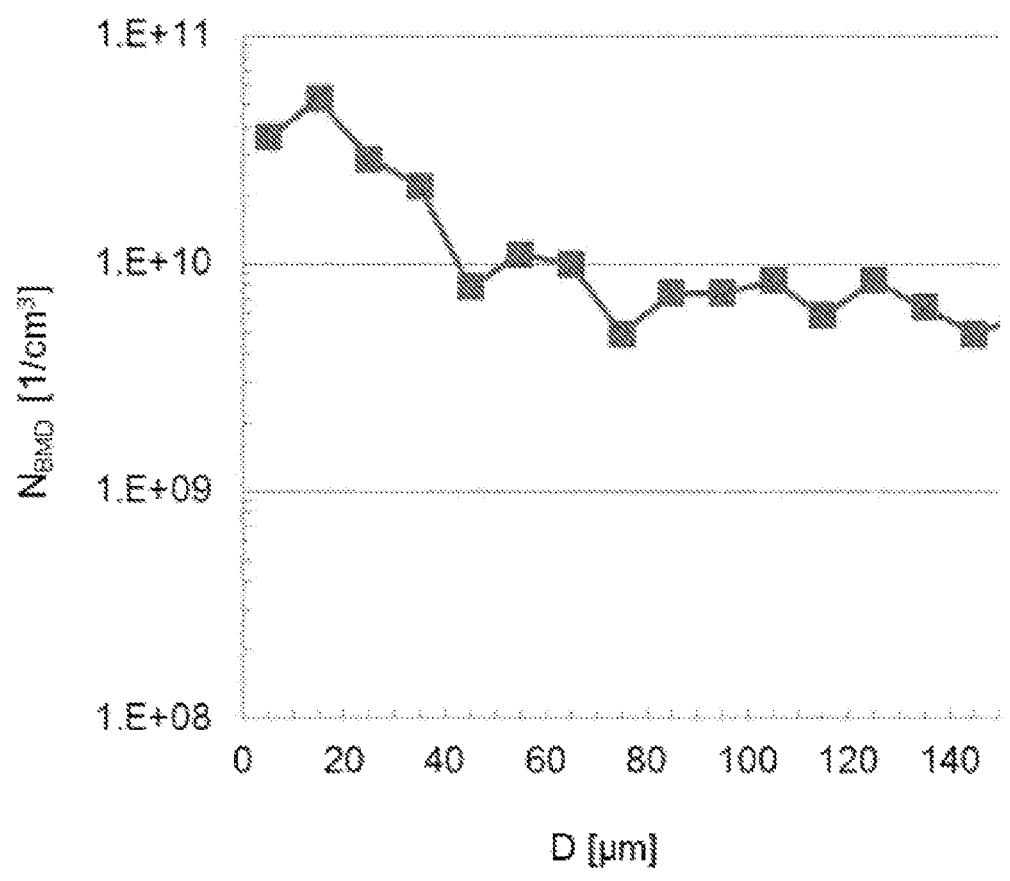

FIG. 3 shows the profile of the density of BMDs ($N_{BMD}$) as a function of the distance (D) from the front side of a semiconductor wafer epitaxially coated according to the example after a heat treatment in a furnace at a temperature of 850° C. in oxygen over a period of 1 h.

Figure 4:
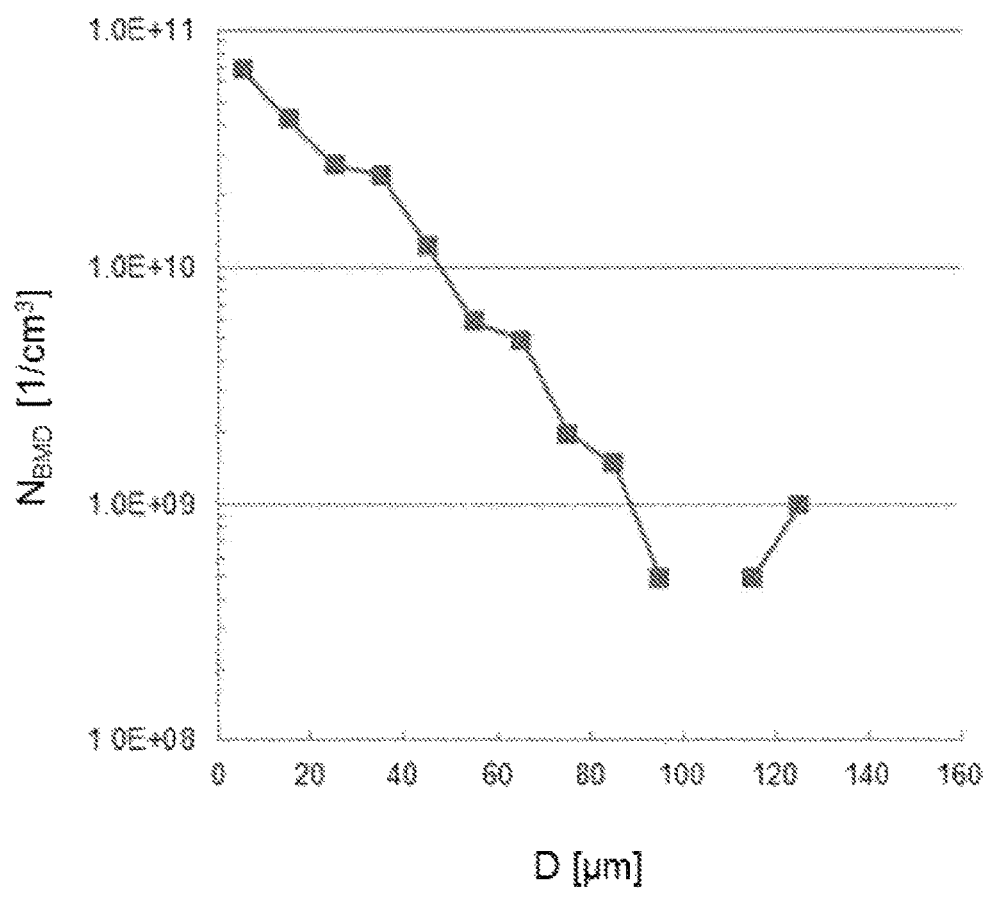

FIG. 4 shows the profile of the density of BMDs ($N_{BMD}$) as a function of the distance (D) from the front side of a semiconductor wafer epitaxially coated according to the example after a heat treatment in a furnace at a temperature of 900° C. in argon over a period of 30 min.

The above description of illustrative embodiments should be regarded as an illustration. The disclosure that has thus been made enables the person skilled in the art firstly to understand the present invention and the associated advantages, and secondly encompasses, within the understanding of the person skilled in the art, obvious alterations and modifications to the structures and methods described as well. Therefore, all such alterations and modifications and equivalents shall be covered by the scope of protection of the claims.

What is claimed is:

1. A method of producing a $p/p^+$ epitaxially coated semiconductor wafer of monocrystalline silicon, comprising:
   pulling a single crystal of silicon at a pulling rate from a melt doped with boron in a crucible, where the concentration of oxygen in an envisaged section of the single crystal is not less than $5.3 \times 10^{17}$ atoms/$cm^3$ and not more than $6.0 \times 10^{17}$ atoms/$cm^3$ and the resistivity of this single crystal is not less than 5 mΩcm and not more than 10 mΩcm;
   cooling the single crystal within a first temperature range from 600° C. to 500° C., where the dwell time within the first temperature range is not less than 353 min and not more than 642 min, and cooling the single crystal within a second temperature range from 500° C. to 400° C., where the dwell time within the second temperature range is not less than 493 min and not more than 948 min;
   dividing a substrate wafer from the envisaged section of the cooled single crystal; and depositing a p-doped epitaxial layer of monocrystalline silicon on a polished upper side face of the substrate wafer.

2. The method of claim 1, further comprising pulling the single crystal at a pulling rate of not less than 0.4 mm/min and not more than 1.8 mm/min.

3. The method of claim 1, further comprising subjecting the melt to a magnetic field.

4. The method of claim 1, further comprising omitting deliberate addition of carbon or of nitrogen or of carbon and of nitrogen to the melt.

5. The method of claim 1, comprising cooling of the single crystal in a water-cooled cooler.

6. The method of claim 1, wherein deposition of the epitaxial layer is a first heat treatment of the substrate wafer, which is effected at a temperature of more than 700° C.

\* \* \* \* \*